US011837848B2

(12) United States Patent
Crawford et al.

(10) Patent No.: US 11,837,848 B2
(45) Date of Patent: Dec. 5, 2023

(54) HIGH PRF, HIGH EFFICIENCY LASER DIODE DRIVER POWER SUPPLY

(71) Applicants: Ian D Crawford, Longwood, FL (US); Jeff Richter, Longwood, FL (US)

(72) Inventors: Ian D Crawford, Longwood, FL (US); Jeff Richter, Longwood, FL (US)

(73) Assignee: Analog Modules, Inc., Longwood, FL (US)

( * ) Notice: Subject to any disclaimer, the term of this patent is extended or adjusted under 35 U.S.C. 154(b) by 670 days.

(21) Appl. No.: 17/037,676

(22) Filed: Sep. 30, 2020

(65) Prior Publication Data

US 2021/0098965 A1 Apr. 1, 2021

Related U.S. Application Data

(60) Provisional application No. 62/907,728, filed on Sep. 30, 2019.

(51) Int. Cl.
*H01S 5/042* (2006.01)
*H05B 45/385* (2020.01)
*H02M 1/32* (2007.01)
*H02J 7/34* (2006.01)

(52) U.S. Cl.
CPC ............ *H01S 5/0428* (2013.01); *H02J 7/345* (2013.01); *H02M 1/32* (2013.01); *H05B 45/385* (2020.01); *H02J 2207/50* (2020.01); *H02M 1/322* (2021.05)

(58) Field of Classification Search
CPC ..... H01S 5/0428; H02J 7/345; H02J 2207/50; H02M 1/32; H02M 1/322; H02M 3/158; H05B 45/385; H05B 45/32

USPC ....................................................... 372/38.04
See application file for complete search history.

(56) References Cited

U.S. PATENT DOCUMENTS

| | | | |
|---|---|---|---|
| 4,276,592 A * | 6/1981 | Goldman | ............ H01L 27/0727 257/E27.033 |
| 4,571,506 A * | 2/1986 | Lisco | ................... H04B 10/564 327/109 |
| 5,461,297 A | 10/1995 | Crawford | |
| 6,087,811 A | 7/2000 | Crawford | |
| 6,587,490 B2 | 7/2003 | Crawford | |
| 6,646,479 B1 | 11/2003 | Crawford | |
| 6,697,402 B2 | 2/2004 | Crawford | |
| 6,856,119 B2 | 2/2005 | Crawford | |

(Continued)

OTHER PUBLICATIONS

Nanosecond Laser Driver Reference Design for LiDAR, TI Designs: TIDA-01573, Feb. 2018, 21 pages, http://www.ti.com/lit/ug/tidue52/tidue52.pdf.

(Continued)

*Primary Examiner* — Vu A Vu
(74) *Attorney, Agent, or Firm* — Gerald E Linden (57) ABSTRACT

A fly-back or boost stage transfers its stored energy to the energy storage capacitor of the fast driver discharge stage in a single event pulse. The charging voltage of a single flyback pulse on the capacitor is measured in real time and, if necessary, the charging current is diverted via a shunt active device or transistor, to ground, thus preventing the storage capacitor from overcharging with the risk of component damage. A series sense resistor is used to determine the presence and amount of the wasted shunt current in order that this current may be minimized by turning down the flyback energy, thus maximizing the overall efficiency.

19 Claims, 4 Drawing Sheets

(56) References Cited

U.S. PATENT DOCUMENTS

| | | | | |
|---|---|---|---|---|
| 6,885,016 B2 * | 4/2005 | Worley | ............. | H02M 3/33523 |
| | | | | 250/227.24 |
| 7,262,584 B2 * | 8/2007 | Crawford | ............... | H05B 45/37 |
| | | | | 323/272 |
| 7,348,948 B2 | 3/2008 | Crawford | | |
| 8,110,835 B2 * | 2/2012 | Kumar | ................... | H05B 45/44 |
| | | | | 362/249.05 |
| 8,120,273 B2 * | 2/2012 | Edwards | ................ | H05B 45/14 |
| | | | | 315/225 |
| 8,184,670 B2 | 5/2012 | Crawford | | |
| 8,207,711 B2 | 6/2012 | Crawford | | |
| 8,482,211 B2 * | 7/2013 | Marent | .............. | H05B 45/3725 |
| | | | | 315/210 |
| 8,729,870 B2 | 5/2014 | Crawford | | |
| 8,742,695 B2 * | 6/2014 | Wray | .................... | H05B 45/40 |
| | | | | 315/307 |
| 8,970,472 B2 * | 3/2015 | Ha | ......................... | H05B 45/44 |
| | | | | 315/307 |
| 9,185,762 B2 * | 11/2015 | Mark | ......................... | G01J 1/46 |
| 9,603,213 B1 * | 3/2017 | Suttles | .................... | H05B 45/20 |
| 9,748,858 B2 * | 8/2017 | Palmer | ................ | H02M 1/4208 |
| 10,250,011 B2 * | 4/2019 | Van Der Tempel | .... | G01S 7/484 |
| 10,511,142 B2 | 12/2019 | Crawford et al. | | |
| 10,777,967 B2 | 9/2020 | Crawford et al. | | |
| 2011/0115407 A1 * | 5/2011 | Wibben | ................. | H05B 45/20 |
| | | | | 315/294 |
| 2018/0323576 A1 | 11/2018 | Crawford et al. | | |

OTHER PUBLICATIONS

Xx555 Precision Timers, Texas Instruments, 37 pages, http://www.ti.com/lit/ds/symlink/ne555.pdf.

High Speed CMOS timer, Advanced Linear Devices, Inc., 7 pages, http://www.aldinc.com/pdf/ALD555.pdf.

* cited by examiner

FIG. 1
Prior Art Current Driver

FIG. 2
single pulse charging power converter

FIG. 2A
single pulse charging power converter
with additional comparator and reference

FIG. 3A
Resistor Impementation

FIG. 3B
OP Amp Impementation

HIGH PRF, HIGH EFFICIENCY LASER DIODE DRIVER POWER SUPPLY

CROSS-REFERENCE(S) TO RELATED APPLICATION(S)

This is a nonprovisional filing of U.S. 62/907,728 filed 30 Sep. 2019, incorporated by reference herein.

TECHNICAL FIELD

This invention relates to a power supply and method for pulsed lasers or other devices that need an energy storage capacitor recharged quickly and efficiently to run at high PRF (pulse repetition frequency) rates. An example would be for automobile LIDAR used in self-driving applications. In this example a laser emitter load is used but the techniques disclosed herein may be applicable to any load that discharges an energy storage capacitor repetitively.

BACKGROUND

Pulsed laser diodes require a short high current pulse that is conventionally provided from a storage capacitor. The capacitor needs to be charged to a relatively high voltage in order to quickly overcome the intrinsic inductance of the load. For further description of a high speed laser driver see, for example, US 2018/0323576 (U.S. Pat. No. 10,511,142).

It is desirable to allow the storage capacitor to discharge, forming a pulse forming network (PFN) with the series inductance of the emitter. Maintaining a fixed voltage as is currently done is not efficient as the high voltage source (PSU) needed for a fast risetime is much more than the voltage of the emitter load. The difference is absorbed in the switching device or circuit as a power loss.

For LIDAR use a narrow pulse width, nanoseconds, at a high current, 100 amps, and fast pulse repetition rate (PRF), 1 MHz, is desired. If the energy storage capacitor is allowed to discharge, it interacts with the output filter of the power source (PSU) causing ringing and other issues, so it must be isolated practically with a resistor.

Resistively charging an energy storage capacitor from a fixed voltage is only 50% efficient as the energy replaced in the capacitor is also dissipated in the resistor. The combination of this loss and the absorbed power losses due to the switch transistor drop makes present designs very inefficient and creates a difficulty removing the heat in the small architecture needed for very fast pulses. The high repetition rates desired exacerbate these losses.

Some Patents and Publications

Some of the following US patents or publications may be of interest . . .

| | | |
|---|---|---|
| 2018/0,323,576 | 2018 Nov. 08 | Crawford |
| Ser. No. 10/511,142 | 2019 Dec. 17 | Crawford |
| U.S. Pat. No. 8,729,870 | 2014 May 20 | Crawford |
| U.S. pat. No. 8,207,711 | 2012 Jun. 26 | Crawford |
| U.S. pat. No. 8,184,670 | 2012 May 22 | Crawford |
| U.S. pat. No. 7,348,948 | 2008 Mar. 25 | Crawford |
| U.S. pat. No. 7,262,584 | 2007 Aug. 28 | Crawford |
| U.S. pat. No. 6,856,119 | 2005 Feb. 15 | Crawford |
| U.S. pat. No. 6,646,479 | 2003 Nov. 11 | Crawford |
| U.S. pat. No. 6,587,490 | 2003 Jul. 01 | Crawford |
| U.S. pat. No. 6,697,402 | 2004 Feb. 24 | Crawford |
| U.S. pat. No. 6,087,811 | 2000 Jul. 11 | Crawford |
| U.S. pat. No. 5,461,297 | 1995 Oct. 24 | Crawford |

SUMMARY

It is an object of the invention, generally, to provide improved pulsed laser diode drivers and methods.

It is an object of the invention to provide a more efficient and reliable power source for charging energy storage capacitors that are discharged repetitively at a fast rate (such as 1 Mhz) when compared to the switching frequency (such as 200 KHz) of typical switching power supplies.

According to the invention, generally, a fly-back or boost stage transfers its stored energy to the energy storage capacitor of the fast driver discharge stage in a single event pulse. The charging voltage of a single flyback pulse on the capacitor is measured in real time and, if necessary, the charging current is diverted via a shunt active device or transistor, to ground, thus preventing the storage capacitor from overcharging with the risk of component damage. A series sense resistor is used to determine the presence and amount of the wasted shunt current in order that this current may be minimized by turning down (reducing, adjusting) the flyback energy, thus maximizing the overall efficiency.

In this manner, the inductively stored flyback energy may be adjusted to match the energy lost from the storage capacitor (used by the laser emitter circuit). In this way the energy storage capacitor can be recharged and regulated at MHz rates with high efficiency, and without the discharge transient affecting the power supply output circuit. No dissipative series resistor is necessary.

The techniques disclosed herein, wherein a fly-back or boost stage transfers its stored energy to the energy storage capacitor of the fast driver discharge stage in a single event pulse, may be contrasted with prior art techniques where many pulses are typically used to charge the capacitor.

The techniques disclosed herein may employ some of the following techniques, and may provide some of the following features and advantages:

1. A method of replacing energy lost in an energy storage capacitor using a single energy pulse from an inductor, where the energy in the pulse is equal to or more (greater) than the energy used by the capacitor discharging load. This is applicable to recharging a capacitor that is repetitively discharged into a load such as a laser diode and allows for the power supply to be regulated in a single cycle, or cycle-by-cycle.
2. A method of regulating the voltage on an energy storage capacitor in a pulsed load application to avoid overcharging, using a high-speed loop (12,13,14,15) and a shunt discharging device (16).
3. A method of maximizing efficiency of recharging a capacitor at a high PRF by reducing the energy stored in the charging inductor by means of sensing the current in the shunt device and reducing the charging inductor current to a level where the shunt device is at a minimum value. This is more efficient than using a fixed voltage shunt regulator, as the amount of current being shunted may be minimized.
4. A method of adjusting the monostable pulse width as a function of the input voltage to maintain a constant peak current in the storage inductor. Similar techniques may have been done in the past, but not for the application contemplated herein, which is driving a laser at a high PRF.

5. A method of minimizing the shunt current with different attack and decay times of the shunt current control loop integrator. When the PRF is changing, losses (through 16) may be fine-tuned, and minimized, by monitoring the voltage on the storage capacitor and adjusting the monostable pulse width to adjust the stored energy to compensate for any capacitor voltage errors (such as droop). The attack and decay times of the integrator may be adjusted, for example, by replacing resistor (20) with a network including non-linear elements such as diodes.

6. A method using a safety circuit comprising providing a second comparator (25) to shut down the pulse, to inhibit initiation of new charge energy from the inductor when an intermediate voltage value is stored on the energy storage capacitor.

7. A method where the pulse width timing setting the inductively stored energy is modulated by the power input voltage such as to minimize variations in the instantaneous peak inductor current during power line fluctuations.

According to some embodiments (examples) of the invention, a method of controlling repetitive pulsed firing of a current load (2) comprising an LED or laser diode may comprise: providing a power supply for charging an energy storage capacitor (1); charging the energy storage capacitor with sufficient energy to fire the load (2); connecting the load (2) to the energy storage capacitor (1); intermittently connecting the load (2) to ground through a fast switching device (4); and providing an input trigger pulse (6), through a driver (5) to the fast switching device (4) for intermittently connecting the load (2) to ground so that it fires in a pulsed manner; characterized by: providing an inductor (10) for storing energy to be transferred to the capacitor (1); providing a voltage ($V_{LV}$) to the inductor (10) for charging the inductor (10); intermittently connecting the inductor (10) to ground through a fast switch (9); providing a charge trigger pulse (22), through a pulse width limited monostable driver (8), to the fast switch (9) for intermittently connecting the inductor (10) to ground, so that it discharges into the energy storage capacitor (1) when the fast switch (9) turns off; providing a shunt regulator FET (16) connected to the capacitor (1) and to ground via a sense resistor (17); and measuring the instantaneous voltage across the capacitor (1), comparing it to a first low value reference voltage (14), and turning on the shunt regulator FET (16) when a desired capacitor voltage is reached to stop further charging of the capacitor (1).

The method may further comprise: measuring (17) the value of current pulses through the shunt regulator FET (16); comparing the measured value to a second low value reference voltage (18) to generate an error signal; and using the error signal to modulate the pulse width of the mono stable driver (8). The error signal may be amplified with an amplifier (19), integrating the amplified error signal, and providing the integrated amplified error signal to the monostable driver (8). The amplified error signal may be integrated using a resistor (20) and a capacitor (21). The input trigger pulse (6) initiates the load output; and the charge trigger pulse (22) initiates charging of the inductor (10), which terminates when the monostable driver (8) times out, as modulated by feedback from a control loop comprising the reference voltage 18, amplifier 19, resistor 20, and capacitor 21.

A width of the flyback pulse applied to the capacitor may be corrected using a feed forward correction of pulse width, or using a proportional current to line voltage (VLV), with an OP Amp (31) implementation.

The fast switching device (4) may comprise a Gallium Nitride (GaN) FET; and the fast switch (9) may comprise a Gallium Nitride (GaN) FET.

The input trigger pulse (6) may be passed through a pulse shortening driver (5). The charging voltage of the flyback pulse on the capacitor may be measured in real time and, if necessary, the charging current may be shunted to ground, thereby preventing the storage capacitor from overcharging with the risk of component damage. The flyback energy stored in the inductor may be adjusted to match the energy lost from the storage capacitor when the load is fired.

The energy storage capacitor can be recharged and regulated at MHz rates with high efficiency, and without a discharge transient affecting the power supply output circuit.

Energy lost in the energy storage capacitor may be replaced when the load is fired using a single energy (flyback) pulse from the inductor, wherein the energy in the pulse from the inductor is equal to or more than the energy used by the capacitor discharging into the load.

The energy stored in the charging inductor may be reduced by sensing the current in the shunt device (16); and reducing the current charging the inductor to a level where the shunt device (16) is barely turning on.

The charge trigger pulse (22) and the input trigger pulse (6) may be controlled in one or more of the following three ways (A,B,C):
A) the charge trigger pulse (22) is an initial event, and the input trigger pulse (6) is triggered from the back edge of the charge trigger pulse (22);
B) the charge trigger pulse (22) is generated before the input trigger pulse (6) to allow the output pulse of the load (2) to be synchronized to an external event; and
C) the charge trigger pulse (22) is generated immediately after the input trigger pulse (6) to be ready for another firing of the load (2).

The method may further comprise: measuring the instantaneous voltage across the capacitor (1) with a resistive divider (12,13) that provides a first proportional voltage; and comparing the proportional voltage from the resistive divider to the first low value reference voltage (14), and turning on the shunt regulator FET (16) using a high-speed amplifier (15) having its positive terminal connected to the resistive divider (12,13) its the negative terminal connected to the first reference voltage (14). A comparator (25) may be provided to inhibit or restrict the monostable driver (8) output when the capacitor (1) is in a partially charged state, thereby preventing a new pulse initiation and protecting the shunt regulator FET (16) from overworking until the load (2) has fired to discharge the capacitor (1) or the capacitor (1) has leaked down. The comparator (25) may use a reference voltage which is lower than the first reference voltage (14).

According to some embodiments (examples) of the invention, a power supply for charging an energy storage capacitor (1) which is used for repetitive pulsed firing of a current load (2) comprising an LED or laser diode may comprise: an inductor (10) for storing energy to be transferred to the capacitor (1); a fast switch (9) for intermittently connecting the inductor (10) to ground; a pulse width limited monostable driver (8) receiving a charge trigger pulse (22), and turning the fast switch (9) on and off; and a shunt regulator FET (16) connected to the capacitor (1) and ground; wherein the instantaneous voltage across the capacitor (1) is measured and compared by a high speed amplifier (15) to a low value reference voltage (14), and the shunt regulator FET (16) is turned on when a desired capacitor voltage is reached to stop further charging of the capacitor (1). The power supply may further comprise: a comparator (25) to inhibit or restrict the monostable driver (8) output when the capacitor (1) is in a partially charged state, thereby preventing a new pulse initiation and protecting the shunt regulator FET (16) from overworking until the load (2) has fired to discharge the capacitor (1).

Other objects, features and advantages of the invention will become apparent in light of the following description thereof.

BRIEF DESCRIPTION OF THE DRAWINGS

The structure, operation, and advantages of the present preferred embodiment of the invention will become further apparent upon consideration of the descriptions set forth herein, taken in conjunction with the accompanying figures (FIGs). The figures are intended to be illustrative, not limiting. Legends and notations in the drawings may be considered as part of the description.

DETAILED DESCRIPTION

Reference will be made in detail to various embodiments of the invention, examples of which are illustrated in the accompanying drawings. The drawings are intended to be illustrative, not limiting. Although the invention will be described in the context of these embodiments, it should be understood that it is not intended to limit the spirit and scope of the invention to these particular embodiments.

Many of the elements in the drawings are standard electronic components (resistors, capacitors, LEDs, inductors, comparators, diodes, transistors, FETs, etc.). Parasitic inductances may be shown, using the symbol for an inductor component.

Components such as resistors, capacitors and inductors typically have two terminals, which may be referred to herein as "ends". Some components, such as FETs, typically have three terminals, which may be labeled S, G, D (for source, gate and drain, respectively). In some instances, "signals" may be referred to, and reference numerals or letters may point to lines (conductive paths) that carry said signals.

In the schematic diagrams presented herein, the various electronic components may be connected to one another, as shown, whether or not a given connection is explicitly mentioned in the text.

According to the invention, generally, the charging of the high voltage energy storage capacitor is achieved in a "lossless" manner using the energy stored in an inductor and at the same time a voltage boost is achieved such as to convert a vehicle battery supply to the higher voltage needed for a fast narrow pulse desired for lidar. This invention complements damping and energy recovery improvements, such as disclosed in U.S. Pat. No. 10,511,142 to allow for the highest PRF of narrow pulses to be generated efficiently with low thermal dissipation, a limiting factor.

Figure 1:
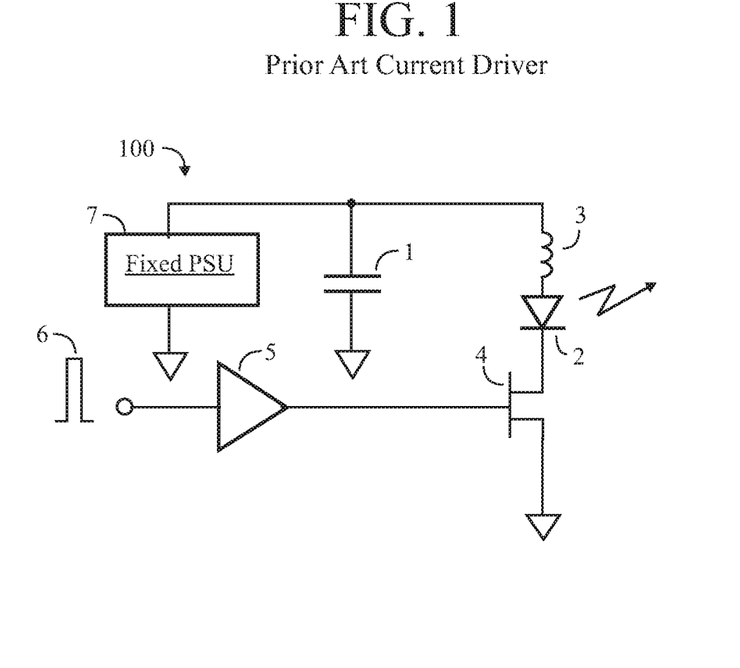
FIG. 1 is a schematic diagram of a current driver using a fixed voltage energy storage capacitor, according to the prior art.

FIG. 1 is a schematic diagram of a prior art current driver 100 using a fixed voltage energy storage capacitor. An energy storage device represented by the capacitor 1 is charged to a high voltage, typically between 100 and 200 volts by a fixed regulated power supply 7. Current through a load such as a light emitting diode (LED) or a laser diode, or arrays thereof represented by emitting diode or laser, 2, is turned on and off by a fast switching device, ideally a Gallium Nitride (GaN) FET 4. The energy required is drawn from the capacitor that is maintained at a constant voltage by a conventional power supply. An example of this design is shown by http://www.ti.com/lit/ug/tidue52/tidue52.pdf Generally, the basic laser diode driver receives an input trigger pulse 6, and this pulse is passed through a pulse shortening driver 5. By limiting the pulse width, the driver 5 ensures that excessive current does not flow though the FET 4 and emitter 2 due to turning FET 4 on for too long a time. The peak current is limited by that pulse width and the series parasitic inductances represented by 3, with the peak current $i=VT/L$ where V is the capacitor 1 voltage, T is the shortened pulse width, and L is the sum of series parasitic inductances lumped together as 3. It may be seen that as V is larger, a higher peak current is achieved. Alternatively, a narrowed pulse may be achieved for the same current value. The driver 5 may also be described as an edge-triggered monostable with a low impedance output to drive the FET 4 gate.

Reducing the value of L to a very low value such as one nanohenry is highly desirable to get high current short pulses, but in some cases, this becomes impractical due to thermal, layout, multiple series diodes, and other considerations.

Having a high stored voltage overcomes the delay in current rise caused by the inductance, but that makes the efficiency of the laser driver poor. The difference (delta) in voltage between the capacitor 1 value and the voltage across the load 2, times the high current flowing is wasted watts.

US 2018/0323576 (U.S. Pat. No. 10,511,142) addresses this challenge and describes how allowing the energy storage capacitor to discharge can result in a higher efficiency if it acts more like a pulse forming network using a smaller storage capacitor and series inductance as the CL network.

With this capacitor discharge comes the requirement to rapidly recharge the capacitor to the initial voltage for the next pulse that may occur, for example, 1 microsecond later. A fixed power supply does not work in this mode as it becomes part of the nanosecond fast discharge source and must work, generally inefficiently, to reset the regulation point by replacing the removed energy.

Resistive isolation of the PSU from the discharge network is inefficient as described above, and a choke isolator causes ringing due to resonance with the energy storage capacitor.

The solution to this problem is the subject of the invention described in FIGS. 2, 2A, 3A, 3B.

Figure 2:
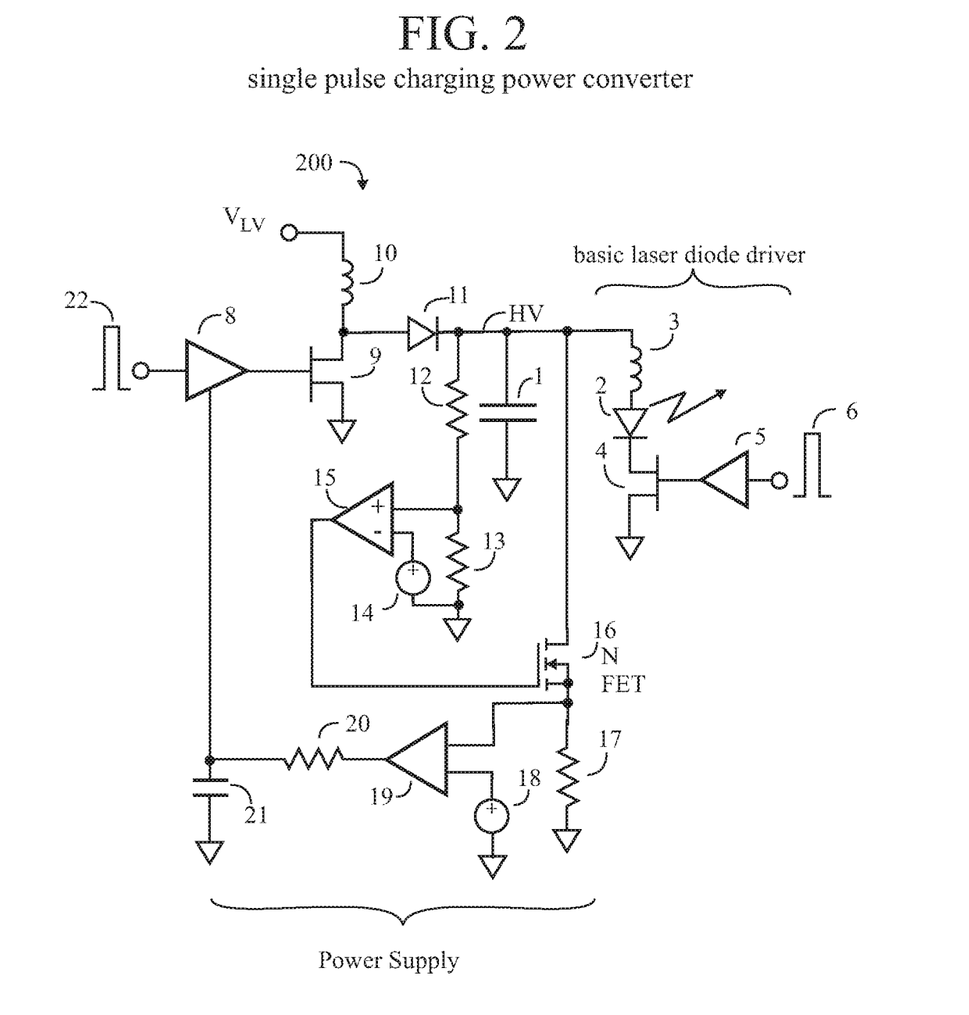
FIG. 2 is a schematic diagram of a single pulse charging power converter together with basic laser diode driver parts, according to the invention.

FIG. 2 is a schematic diagram showing the single pulse charging power converter that replaces the fixed power supply (7, FIG. 1), together with the basic laser diode driver parts.

An input pulse 22 triggers a pulse width limited monostable driver (or timer) 8 that turns on a fast switch 9, typically a GaN FET, to charge up an inductor 10. The inductor is supplied from a low voltage source ($V_{LV}$), typically 12 VDC. The "on" time is set to store enough energy in the inductor to achieve a full charge on the energy storage capacitor 1 to the required operating voltage, as described with respect to FIG. 1.

The energy in the inductor 10 is $0.5Li^2$ where "L" is the inductance value and "i" is the inductor peak current flowing at the end of the monostable pulse. This energy in the inductor is initially set to be slightly greater than the energy required to charge the capacitor, $0.5\ CV^2$ where C is the capacitance value and V is the final desired charge voltage.

When the FET 9 is turned off, the current flowing through inductor 10 and FET 9 is diverted through fast diode 11 to charge the energy storage capacitor 1 (on the line labeled "HV"). Note that the capacitor 1 in FIG. 2 may typically be a much smaller value than that of the capacitor 1 in FIG. 1, because the circuit in FIG. 1 operated at a fixed PSU voltage whereas the voltage in capacitor 1 is preferentially discharged, such as described in US 2018/0323576 (U.S. Pat. No. 10,511,142). An exemplary value for the storage capacitor 1 in FIG. 1 may be 2 nF, and an exemplary value for the storage capacitor 1 in FIG. 2 may be 20 nF The instantaneous voltage across the capacitor 1 is monitored via a resistive divider 12 and 13, and the proportional voltage is compared to a low value reference voltage (V) 14 using a high-speed amplifier 15 with the positive terminal connected to the divider 12 and 13 and the negative terminal connected to a reference voltage (V) 14. The output of the high-speed amplifier 15 turns on a fast transistor or FET 16, which may be an N-channel FET made from Gallium Nitride, when a desired capacitor voltage is reached to stop further charging of the capacitor (1).

The FET 16 discharges the storage capacitor 1 should it exceed the demanded high voltage as calculated by reference V 14*(R12+R13)/R13, thus preventing excess voltage on the storage capacitor 1 by stabilizing it, operating as a shunt regulator. Of course, there is a loss of efficiency if current is bled away from the storage capacitor 1, so it is important to minimize this.

Resistor 17 provides a voltage proportional to the (measured) value of current pulses through shunt regulator FET 16, and it is desirable to minimize their time and value by reducing the energy stored in inductor 10 to be transferred to the energy storage capacitor 1. The voltage across resistor 17 is compared to a low voltage (V) reference 18 and the error signal is amplified by amplifier 19 and integrated by an integrator comprising resistor 20 and capacitor 21.

The integrator (20, 21) could alternatively be embodied in the amplifier 19 using a feedback capacitor to the inverting input, as is well known. The amplifier 19 inputs are connected in a sense that reduces the pulse width to FET 9 when more current flows in sense resistor 17. In a monostable this is achieved by increasing the current to the timing capacitor, or preferably by applying a change in voltage to the control pin. as is described below.

The integrating resistor 20 and capacitor 21 components may be incorporated into the amplifier 19 to create an integrating amplifier configuration, as is well known.

The output of the integrator (20, 21) is used to modulate the pulse width of monostable driver 8 in manner similar to the 555-microcircuit shown in the application note 9.2.2 of the TI data sheet. http://www.ti.com/lit/ds/symlink/ne555.pdf. Faster versions of this part are available, such as the ALD555 http://www.aldinc.com/pdf/ALD555.pdf Initially the pulse width set by the monostable timer 8 time is set to create a high current in FET 9 and inductor 10 to generate enough energy to charge the capacitor 1 to the desired voltage required for the driver. However, after the first (initial) pulse, the residual voltage on capacitor 1 may be above zero, and therefore the required recharge energy for the second (and subsequent) pulses may be less than that for the first charging pulse, leading to a potential overcharging situation. In this case the pulse current in the shunt transistor 16 exceeding small threshold 18 is amplified by amplifier 19 and accumulates charge in the integrating capacitor 21 set in a polarity to modulate the output of the monostable timer driver 8 in a shorter pulse-width direction until the current in the shunt regulator FET 16 and sense resistor 17 falls to nearly zero. At this operating point, the efficiency is high, as the energy stored in the inductor substantially matches the energy discharged from the capacitor. If the storage capacitor 1 fails to reach the desired voltage (for example by a loss in stored energy due to a drop in the power line $V_{LV}$) then no current flows in the shunt FET 16 or resistor 17 and the integrator slews to increase the pulse width of monostable 8 to increase the charging energy. The time constant of the integrator may be set to match the application, and the attack and decay times could be different to maximize the efficiency and deal with any changing PRF's. (PRF is Pulse Repetition Frequency)

In the manner shown in FIG. 1, the driver receives an input trigger pulse 6, and this pulse is passed through a pulse shortening driver 5.

Note that in FIG. 1, only a single input pulse 6 is shown. As described in greater detail below, in FIG. 2, two pulses 22 and 6 are shown. Generally, the pulse 22 precedes the pulse 6, so that the storage capacitor 1 will be charged before it is discharged into the load (laser diode) 2.

Pulse Timing

The input trigger pulse (6) and the charge trigger pulse (22) may be provided by a conventional pulse generator, a DSP, or a FPGA. The input trigger pulse (6), as modified by the pulse shortening driver (5), defines the timing and width of the laser diode (load) output. The charge trigger pulse (22) controls the charging of the energy storage capacitor (1). There are 3 ways to control the relative timing of the pulses 6 and 22.

A) The charge trigger pulse 22 may be the initial event and the pulse 6 is triggered from the back edge of that pulse 22. This ensures that the energy storage capacitor is fully charged just before the laser firing. This is the preferred method. It is desirable that the sense resistors 12 and 13 be of high value to minimize leakage from the energy storage capacitor 1. A small phase-lead capacitor typically in the picofarad range is likely required in parallel with resistor 12 to preserve the loop feedback speed.

B) Depending on the storage capacitor 1 droop, the pulse 22 may be generated some time before the laser firing 6 to allow the laser pulse to be synchronized to an external event.

C) The pulse 22 may be generated immediately after the laser firing pulse 6 to be ready for another laser firing. This is applicable at higher repetition rates where capacitor 1 has not had time to leak down.

Safety Features

Because of the high currents and voltages involved with sensitive parts it may be desirable to add certain safety features.

Figure 2A:
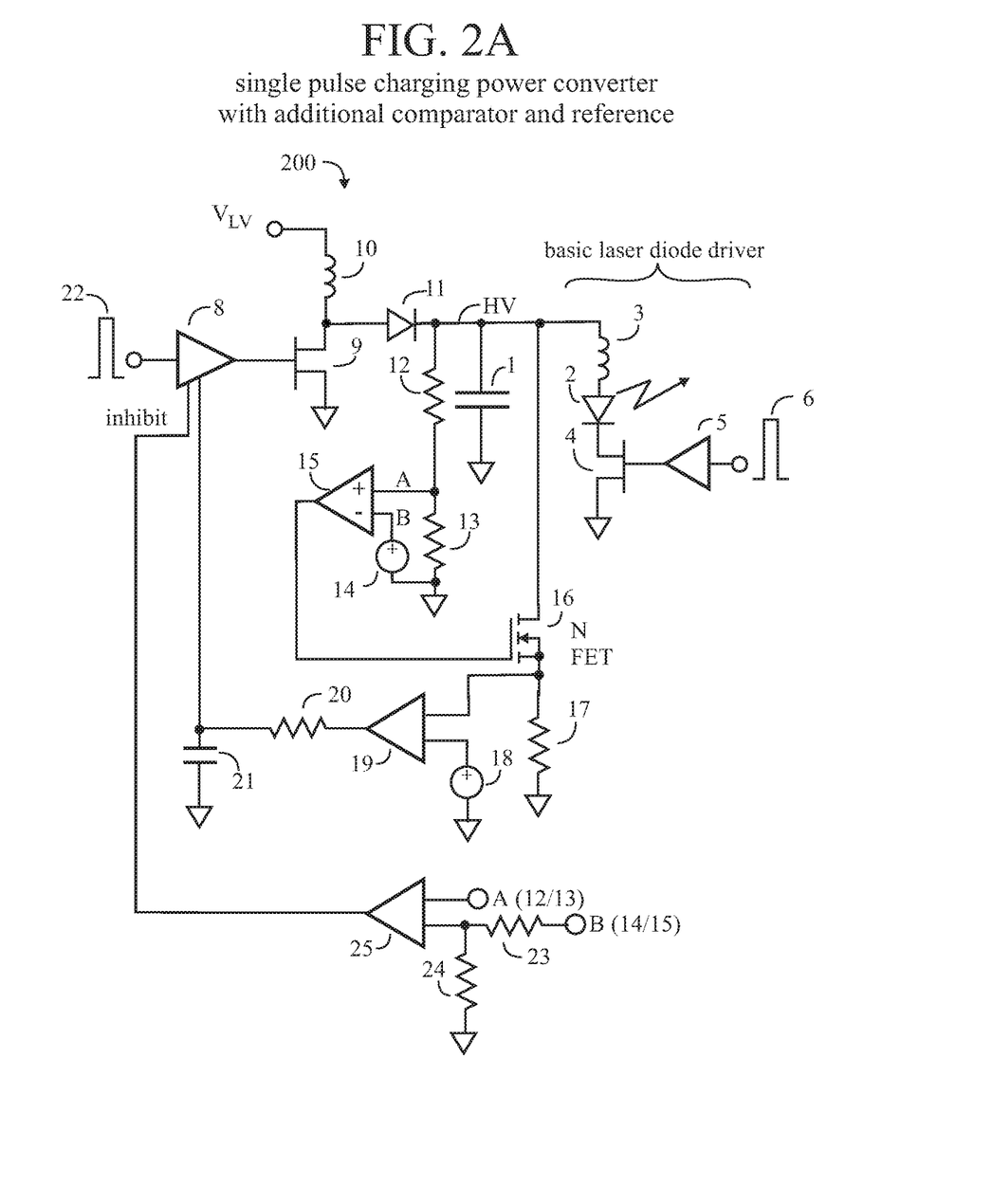
FIG. 2A is a schematic diagram of a single pulse charging power converter together with basic laser diode driver parts, with additional comparator and reference, according to the invention.

FIG. 2A shows that a comparator 25 and reference may be added to inhibit or restrict the monostable driver 8 output when the capacitor 1 is in a partially charged state, for example 80V. This feature would prevent a new pulse initiation and protect the shunt regulator FET 16 from overworking until the laser diode 2 has fired to discharge the capacitor 1. The comparator 25 could use the same divider node (A) between resistors 12 and 13 with a lower reference voltage (B) than 14, such as approximately half, as set by resistors 23 and 24, from point B reference 14. As is known to those skilled in the art there are several ways to achieve the same effect, such as making the lower reference a tap in resistor 13 replacing resistors 23 and 24. The input phase of comparator 25 is set to inhibit the monostable output when the voltage at node A is above the reference node junction of resistors 23 and 24, thus preventing the inductor from charging. In the 555 example this would go to the RESET pin. The output ("inhibit") of the comparator 25 is a digital signal provided to the monostable 8.

Normally, a monostable (such as 8) is timed by means of a resistor charging a timing capacitor from a stable low voltage IC power line (see 555 applications). For efficiency, the inductor 10 is powered directly from the normally higher input prime power and, if this fluctuates, the energy stored in inductor 10 will also change as the peak current changes in proportion for a fixed pulse width. i=VT/L where V is the input voltage, T is the pulse width (FET on time), and L is the inductance value. T and L are fixed in the short term.

Figure 3A:
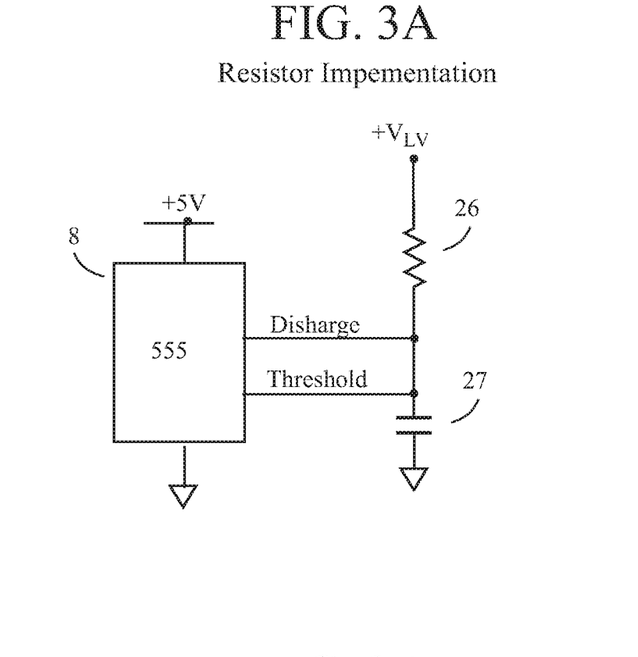
FIG. 3A is a schematic diagram of a monostable feed forward correction of pulse width, using a resistor implementation, according to the invention.
Figure 3B:
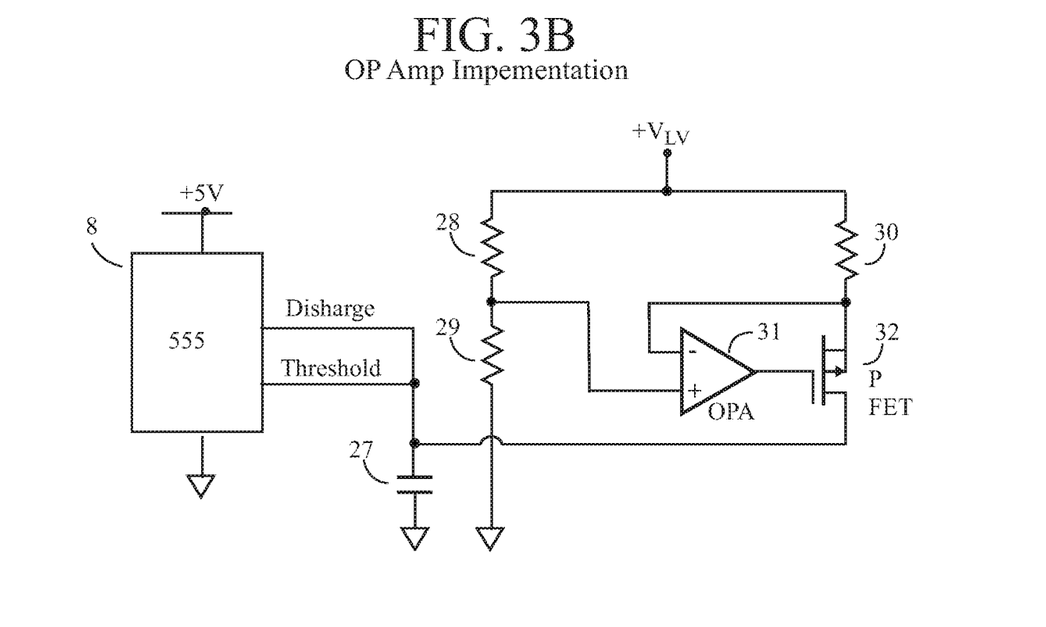
FIG. 3B is a schematic diagram of a monostable feed forward correction of current using a proportional current to line voltage, with an OP Amp implementation, according to the invention.

FIG. 3A shows that if a larger-value charging resistor 26 for the monostable timer 8 (555 example shown here) is taken from the input power line $V_{LV}$ instead of the regulated IC power, for example +5V, then higher input voltages on $V_{LV}$ will result in narrower pulses due to increased current flow in this timing resistor charging the timing capacitor 27 faster to its reference. This method works best if the line voltage $V_{LV}$ is much higher than the capacitor 27 voltage so that the charging current may be directly proportional to the line voltage. This is intended to maintain a constant peak inductor current regardless of variations in $V_{LV}$. The timing capacitor current is set by $V_{LV}$ less the voltage (Vc) on the capacitor divided by resistor 26 value, so it is not exactly proportional to $V_{LV}$. FIG. 3B illustrates how this problem may be overcome.

FIG. 3B shows that a more accurate correction may be achieved by using an operational amplifier (OPA) to create a current a current source for the timing capacitor with the current exactly proportional to the input power voltage +$V_{LV}$. Resistors 28 and 29 create a voltage at the positive input to operational amplifier 31 proportional to +$V_{LV}$. The amplifier 31 adjusts the gate of a P type FET 32 so that the source voltage connected to the inverting input is equal to the voltage across resistor 28. The voltage across resistor 30 is held identical by the operation of the operational amplifier and defines the source current that now varies proportionally to the line voltage. The FET 32 drain current is equal to the source current but comes from a high impedance creating a true current source. FIGS. 3A and 3B show a 555 timing circuit with its timing capacitor 27.

For example, if the power line voltage $V_{LV}$ increased by 10%, then the inductor 19 current would increase also by 10%. (i=VT/L). If the input current to the timing capacitor also increased by 10% as a feed forward feature, then the pulse width would shorten by 10% resulting in the same inductor 10 peak current i and no change in the stored energy ($0.5Li^2$), requiring less correction or work for the shunt regulator to do, reducing its dissipation and therefore increasing the overall efficiency.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. A method of controlling the repetitive pulsed firing of a current load (2) comprising an LED or laser diode, the method comprising:
    providing a power supply for charging an energy storage capacitor (1);
    charging the energy storage capacitor with sufficient energy to fire the load (2);
    connecting the load (2) to the energy storage capacitor (1);
    intermittently connecting the load (2) to ground through a fast switching device (4); and
    providing an input trigger pulse (6), through a driver (5) to the fast switching device (4) for intermittently connecting the load (2) to ground so that it fires in a pulsed manner;
    characterized by:
    providing an inductor (10) for storing energy to be transferred to the capacitor (1);
    providing a voltage ($V_{LV}$) to the inductor (10) for charging the inductor (10);
    intermittently connecting the inductor (10) to ground through a fast switch (9);
    providing a charge trigger pulse (22), through a pulse width limited monostable driver (8), to the fast switch (9) for intermittently connecting the inductor (10) to ground, so that it discharges into the energy storage capacitor (1) when the fast switch (9) turns off;
    providing a shunt regulator FET (16) connected to the capacitor (1) and to ground via a sense resistor (17); and
    measuring the instantaneous voltage across the capacitor (1), comparing it to a first low value reference voltage (14), and turning on the shunt regulator FET (16) when a desired capacitor voltage is reached to stop further charging of the capacitor (1);
    further comprising:
    measuring (17) the value of current pulses through the shunt regulator FET (16);
    comparing the measured value to a second low value reference voltage (18) to generate an error signal; and
    using the error signal to modulate the pulse width of the monostable driver (8).

2. The method of claim 1, further comprising:
    amplifying the error signal with an amplifier (19), integrating the amplified error signal, and providing the integrated amplified error signal to the monostable driver (8).

3. The method of claim 2, wherein:
    the amplified error signal is integrated using a resistor (20) and a capacitor (21).

4. The method of claim 3, wherein:
    the input trigger pulse (6) initiates the load output; and
    the charge trigger pulse (22) initiates charging of the inductor (10), which terminates when the monostable driver (8) times out, as modulated by feedback from a control loop comprising the reference voltage (18), amplifier (19), resistor (20), and capacitor (21).

5. The method of claim 4, wherein the charge trigger pulse (22) and the input trigger pulse (6) are controlled in one or more of the following three ways (A,B,C):
- A) the charge trigger pulse (22) is an initial event, and the input trigger pulse (6) is triggered from the back edge of the charge trigger pulse (22);
- B) the charge trigger pulse (22) is generated before the input trigger pulse (6) to allow the output pulse of the load (2) to be synchronized to an external event; and
- C) the charge trigger pulse (22) is generated immediately after the input trigger pulse (6) to be ready for another firing of the load (2).

6. The method of claim 1, further comprising:
correcting a width of the flyback pulse applied to the capacitor, using a feed forward correction of pulse width.

7. The method of claim 1, further comprising:
correcting a width of the flyback pulse applied to the capacitor, using a proportional current to line voltage (VLV), with an OP Amp (31) implementation.

8. The method of claim 1, wherein:
the fast switching device (4) comprises a Gallium Nitride (GaN) FET; and
the fast switch (9) comprises a Gallium Nitride (GaN) FET.

9. The method of claim 1, further comprising:
passing the input trigger pulse (6) through a pulse shortening driver (5).

10. The method of claim 1, further comprising:
measuring the charging voltage of the flyback pulse on the capacitor in real time and shunting the charging current to ground, thereby preventing the storage capacitor from overcharging with the risk of component damage.

11. The method of claim 1, wherein:
the flyback energy stored in the inductor is adjusted to match the energy lost from the storage capacitor when the load is fired.

12. The method of claim 1, wherein:
the energy storage capacitor is recharged and regulated at MHz rates with high efficiency, and without a discharge transient affecting the power supply output circuit.

13. The method of claim 1, wherein:
energy lost in the energy storage capacitor when the load is fired is replaced using a single energy (flyback) pulse from the inductor, wherein the energy in the pulse from the inductor is equal to or more than the energy used by the capacitor discharging into the load.

14. The method of claim 1, further comprising:
reducing the energy stored in the charging inductor by sensing the current in the shunt device (16); and
reducing the current charging the inductor to a level where the shunt device (16) is barely turning on.

15. The method according to claim 1, wherein:
the charging voltage of a single flyback pulse on the capacitor is measured in real time and, if necessary, the charging current is diverted via a shunt active device or transistor, to ground.

16. A method of controlling the repetitive pulsed firing of a current load (2) comprising an LED or laser diode, the method comprising:
providing a power supply for charging an energy storage capacitor (1);
charging the energy storage capacitor with sufficient energy to fire the load (2);
connecting the load (2) to the energy storage capacitor (1);
intermittently connecting the load (2) to ground through a fast switching device (4); and
providing an input trigger pulse (6), through a driver (5) to the fast switching device (4) for intermittently connecting the load (2) to ground so that it fires in a pulsed manner;
characterized by:
providing an inductor (10) for storing energy to be transferred to the capacitor (1);
providing a voltage ($V_{LV}$) to the inductor (10) for charging the inductor (10);
intermittently connecting the inductor (10) to ground through a fast switch (9);
providing a charge trigger pulse (22), through a pulse width limited monostable driver (8), to the fast switch (9) for intermittently connecting the inductor (10) to ground, so that it discharges into the energy storage capacitor (1) when the fast switch (9) turns off;
providing a shunt regulator FET (16) connected to the capacitor (1) and to ground via a sense resistor (17); and
measuring the instantaneous voltage across the capacitor (1), comparing it to a first low value reference voltage (14), and turning on the shunt regulator FET (16) when a desired capacitor voltage is reached to stop further charging of the capacitor (1);
further comprising:
measuring the instantaneous voltage across the capacitor (1) with a resistive divider (12,13) that provides a first proportional voltage; and
comparing the proportional voltage from the resistive divider to the first low value reference voltage (14), and turning on the shunt regulator FET (16) using a high-speed amplifier (15) having its positive terminal connected to the resistive divider (12,13) its the negative terminal connected to the first reference voltage (14).

17. The method of claim 16, further comprising:
providing a comparator (25) to inhibit or restrict the monostable driver (8) output when the capacitor (1) is in a partially charged state, thereby preventing a new pulse initiation and protecting the shunt regulator FET (16) from overworking until the load (2) has fired to discharge the capacitor (1) or the capacitor (1) has leaked down.

18. The method of claim 17, wherein:
the comparator (25) uses a reference voltage which is lower than the first reference voltage (14).

19. A power supply for charging an energy storage capacitor (1) which is used for repetitive pulsed firing of a current load (2) comprising an LED or laser diode, comprising:
an inductor (10) for storing energy to be transferred to the capacitor (1);
a fast switch (9) for intermittently connecting the inductor (10) to ground;
a pulse width limited monostable driver (8) receiving a charge trigger pulse (22), and turning the fast switch (9) on and off; and
a shunt regulator FET (16) connected to the capacitor (1) and ground;
wherein the instantaneous voltage across the capacitor (1) is measured and compared by a high speed amplifier (15) to a low value reference voltage (14), and the shunt regulator FET (16) is turned on when a desired capacitor voltage is reached to stop further charging of the capacitor (1);

further comprising:

a comparator (25) to inhibit or restrict the monostable driver (8) output when the capacitor (1) is in a partially charged state, thereby preventing a new pulse initiation and protecting the shunt regulator FET (16) from overworking until the load (2) has fired to discharge the capacitor (1).

* * * * *